(12) United States Patent
Nakiboğlu et al.

(10) Patent No.: US 10,775,707 B2
(45) Date of Patent: Sep. 15, 2020

(54) LITHOGRAPHIC APPARATUS AND METHOD

(71) Applicant: ASML Netherlands B.V., Veldhoven (NL)

(72) Inventors: Güneş Nakiboğlu, Eindhoven (NL); Manon Elise Will, Eindhoven (NL); Sander Catharina Reinier Derks, Budel (NL); Johannes Wilhelmus Mollen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/339,948

(22) PCT Filed: Sep. 21, 2017

(86) PCT No.: PCT/EP2017/073847
§ 371 (c)(1),
(2) Date: Apr. 5, 2019

(87) PCT Pub. No.: WO2018/065222
PCT Pub. Date: Apr. 12, 2018

(65) Prior Publication Data
US 2020/0041916 A1 Feb. 6, 2020

(30) Foreign Application Priority Data
Oct. 7, 2016 (EP) ..................................... 16192775

(51) Int. Cl.
*G03F 7/20* (2006.01)
*G03F 9/00* (2006.01)

(52) U.S. Cl.
CPC ...... *G03F 7/70875* (2013.01); *G03F 7/70716* (2013.01); *G03F 7/70891* (2013.01); *G03F 9/7096* (2013.01)

(58) Field of Classification Search
CPC ............ G03F 7/70525; G03F 7/70875; G03F 7/70758
(Continued)

(56) References Cited

U.S. PATENT DOCUMENTS 6,810,298 B2 * 10/2004 Emoto ................ G03F 7/70525
165/206
2001/0055102 A1 12/2001 Emoto
(Continued)

FOREIGN PATENT DOCUMENTS

| GB | 2 321 316 A | 7/1998 |
| JP | S64 19723 A | 1/1989 |
| WO | WO 2018/065222 A1 | 4/2018 |

OTHER PUBLICATIONS

International Search Report and Written Opinion of the International Searching Authority directed to related International Patent Application No. PCT/EP2017/073847, dated Feb. 8, 2018; 13 pages.

*Primary Examiner* — Hung Nguyen
(74) *Attorney, Agent, or Firm* — Sterne, Kessler, Goldstein & Fox P.L.L.C.

(57) ABSTRACT

A method of performing a lithographic exposure of a substrate, the substrate being held on a substrate table, the substrate table comprising a cooling system operative to cool the substrate table, the method comprising performing an alignment measurement of the substrate, applying heat to the substrate table to reduce cooling of the substrate table provided by the cooling system, the heat being applied between a time at which the alignment measurement is performed and a time at which the lithographic exposure is performed and performing the lithographic exposure of the substrate.

21 Claims, 6 Drawing Sheets

(58) Field of Classification Search
USPC .............................................. 355/30, 72–76
See application file for complete search history.

(56) References Cited

U.S. PATENT DOCUMENTS

| | | |
|---|---|---|
| 2002/0014894 A1* | 2/2002 | Yonezawa .......... G01R 31/2865 324/750.08 |
| 2007/0273860 A1 | 11/2007 | Tanaka |
| 2007/0283891 A1 | 12/2007 | Okayama |
| 2015/0116676 A1 | 4/2015 | Zaal et al. |
| 2015/0331338 A1 | 11/2015 | Arlemark et al. |
| 2016/0035605 A1 | 2/2016 | Schmitz et al. |

* cited by examiner

LITHOGRAPHIC APPARATUS AND METHOD

CROSS-REFERENCE TO RELATED APPLICATIONS

This application claims priority of EP application no. 16192775.1, which was filed on 7 Oct. 2016 and which is incorporated herein its entirety by reference.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to control the lithographic process to accurately apply a desired pattern onto the substrate, alignment marks are provided on the substrate, and the lithographic apparatus is provided with an alignment system. The alignment system is configured to perform measurements which determine the positions of the alignment marks provided on the substrate. Alignment ms are performed using the measurement made by the alignment system. It may be desirable to provide, for example, a lithographic apparatus and method which improves the accuracy of lithographic exposures.

SUMMARY

According to a first aspect of the invention, there is provided a method of performing a lithographic exposure of a substrate, the substrate being held on a substrate table, the substrate table comprising a cooling system operative to cool the substrate table, the method comprising: performing an alignment measurement of the substrate; applying heat to the substrate table to reduce cooling of the substrate table provided by the cooling system, the heat being applied between a time at which the alignment measurement is performed and a time at which the lithographic exposure is performed; and performing the lithographic exposure of the substrate.

The application of heat to the substrate table advantageously reduces a thermal drift experienced by the substrate that is held by the substrate table. The reduced thermal drift experienced by the substrate results in a more accurate lithographic exposure because target portions of the substrate are closer to their measured alignment positions.

The application of heat may be commenced before the alignment measurement has begun.

The application of heat may be commenced during the alignment measurement.

Applying heat to the substrate table before the alignment measurement has begun or during the alignment measurement may advantageously provide time for the temperature of the substrate table to stabilize such that thermal drift of the substrate is reduced before the lithographic exposure is performed.

The amount of heat applied to the substrate table may be varied over time.

Varying the amount of heat applied to the substrate table over time advantageously grants greater flexibility in reducing thermal drift of the substrate. For example, a first amount of heat may be applied to the substrate table over time in order to stabilize the temperature of the substrate table then a second amount of heat that is less than the first amount of heat may be applied to the substrate table over time in order to maintain the stabilized temperature of the substrate table.

The heat may be distributed across the substrate table to achieve a desired temperature across the substrate table.

Distributing the heat across the substrate table in a desired manner advantageously allows different temperature gradients across the substrate table to be accounted for when reducing a thermal drift of the substrate. For example, if the heat transferred to the substrate table during a lithographic exposure is distributed unevenly across the substrate table then heat may be distributed across the substrate table such that more heat is transferred to some regions of the substrate table than others.

A delay between applying heat to the substrate table and the substrate table changing temperature due to the heat applied to the substrate table may be accounted for when applying heat to the substrate table.

Accounting for a delay between applying heat to the substrate table and the substrate table changing temperature due to the heat applied to the substrate table may advantageously increase the accuracy with which a thermal drift of the substrate is reduced.

The substrate table may comprise a clamp configured to secure the substrate to the substrate table, and the heat may be applied to the clamp.

Applying heat to the clamp may advantageously allow a greater reduction in a thermal drift of the substrate.

The application of heat may be configured such that a temperature of the substrate table at the time at which the alignment measurement is performed is the same as the temperature of the substrate table at a time at which the lithographic exposure of the substrate is performed.

Maintaining the temperature of the substrate table between a time at which the alignment measurement is performed and a time at which the lithographic exposure of the substrate is performed may advantageously minimise a thermal drift of the substrate.

The application of heat may be based on an exposure setting of the lithographic exposure.

One or more lithographic exposure settings such as, for example, different illumination modes (e.g. quadrupole illumination, dipole illumination, etc.), die size, radiation dose, exposure slit size, a substrate table scanning speed, etc. may affect a thermal drift of the substrate. Basing the application of heat on an exposure setting of the lithographic apparatus advantageously allows for the thermal drift of the substrate to be reduced with greater accuracy.

The temperature changes of the substrate table during a lithographic process may be known and the application of heat may occur during a pre-determined interval in the lithographic process, the interval depending on the known temperature changes of the substrate table.

If the temperature changes experienced by the substrate table during a lithographic process are known then heat may be applied to the substrate table at a pre-determined interval in the lithographic process to account for the known temperature changes when reducing a thermal drift of the substrate. Applying heat to the substrate table during a pre-determined interval may be considered as being a feed-forward method.

A temperature of the substrate table may be monitored.

Results of the monitoring may be used to determine a rate at which heat is applied to the substrate table.

According to a second aspect of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table being configured to hold a substrate, the substrate table comprising a cooling system operative to cool the substrate table; a projection system configured to project the patterned radiation beam onto a target portion of the substrate; and, a heating element configured to apply heat to the substrate table to reduce cooling of the substrate table provided by the cooling system.

The lithographic apparatus may include a processor configured to control the heating element, wherein the processor may be further configured to cause the heating element to apply heat to the substrate table between a time at which an alignment measurement of the substrate is performed and a time at which a lithographic exposure of the substrate is performed.

The heating element may comprise an electrical heater.

The heating element may comprise multiple electrical heaters, and the electrical heaters may be distributed across the substrate table to achieve a desired temperature across the substrate table.

The lithographic apparatus may further comprise a feedback loop, the feedback loop comprising a temperature monitor configured to monitor a temperature of the substrate table, the heating element and a processor configured to control the heating element using information received from the temperature monitor, the feedback loop being configured to reduce cooling of the substrate table provided by the cooling system.

The processor may be configured to account for a delay between the application of heat to the substrate table and the substrate table changing temperature due to the heat applied to the substrate table.

The processor may control the heating element via pulse-width modulation of an electrical current provided to the heating element.

According to a third aspect of the invention, there is provided a computer program comprising computer readable instructions configured to cause a computer to carry out a method according to the first aspect of the invention and/or any of its associated options.

According to a fourth aspect of the invention, there is provided a computer readable medium for storing computer readable code wherein the code causes a lithographic apparatus to perform the method of the first aspect of the invention and/or any of its associated options.

According to a fifth aspect of the invention, there is provided a computer apparatus for controlling a lithographic apparatus, the computer apparatus comprising: a memory storing processor readable instructions; and a processor arranged to read and execute instructions stored in said memory; wherein said processor readable instructions comprise instructions arranged to control the computer to carry out a method according to the first aspect of the invention and/or any of its associated options.

BRIEF DESCRIPTION OF THE DRAWINGS

Embodiments of the invention will now be described, by way of example only, with reference to the accompanying schematic drawings, in which.

DETAILED DESCRIPTION

Figure 1:
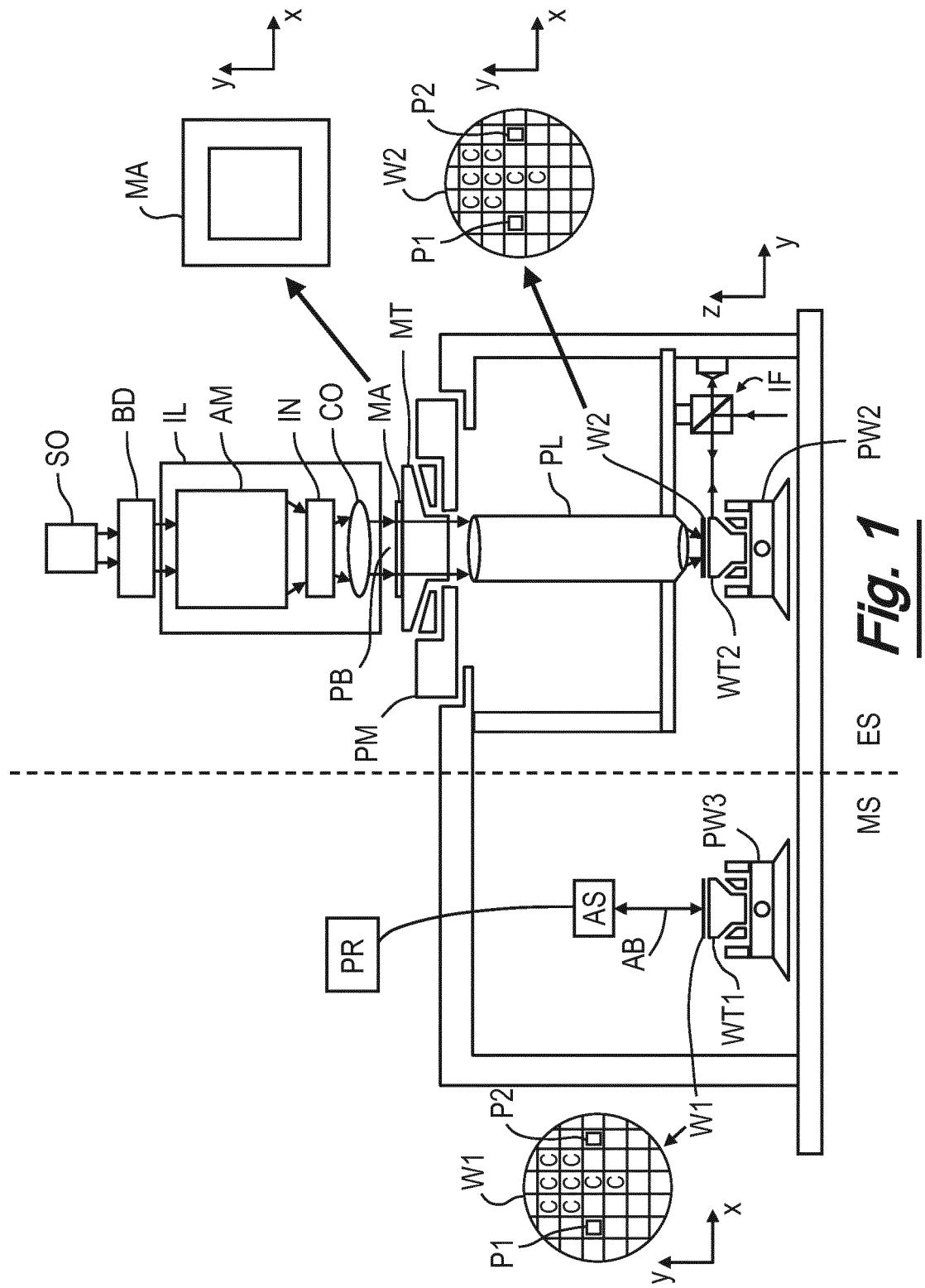
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including deep ultra-violet (DUV) radiation (e.g. having a wavelength of 365, 248, 193 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical substrate clamping, vacuum, or other substrate clamping techniques, for example electrostatic substrate clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

a. an illumination system IL to condition a beam PB of radiation (e.g. UV radiation or EUV radiation).

b. a support structure (which may be referred to as a mask table) MT to support a patterning device (e.g. a mask) MA and connected to first positioning device PM to accurately position the patterning device with respect to item PL;

c. a substrate table (which may be referred to as a wafer table) WT2 for holding a substrate (e.g. a resist coated wafer) W2 and connected to second positioning device PW2 for accurately positioning the substrate with respect to item PL;

d. another substrate table WT1 for holding a substrate W1 and connected to third positioning device PW3 for accurately positioning the substrate with respect to alignment system AS; and e. a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure. The left-hand side of FIG. 1 is herein referred to as a measurement side MS of the lithographic apparatus. A topography measurement system (not shown) configured to measure the topography of a substrate W1 may be provided. The projection system PL is provided on the right-hand side of the figure. The right-hand side of FIG. 1 is herein referred to as the exposure side ES of the lithographic apparatus. The alignment system AS measures the positions of alignment marks provided on the substrate W1 (schematically depicted by boxes P1, P2) which is held on a first substrate table WT1. An alignment radiation beam AB is incident on the substrate W1 and diffracts from alignment marks that are present on the substrate W1. Diffracted radiation is detected by the alignment system AS. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed at the exposure side ES using patterned radiation projected by the projection system PL. The already exposed wafer W2 supported by the second substrate table WT2 is removed from the substrate table for subsequent processing. Another substrate is then placed on the second substrate table WT2 at the measurement side MS for measurement by the alignment system AS prior to exposure on the exposure side ES using patterned radiation projected by the projection system PL.

An interferometer (not depicted) and/or other position measurement means may be used to monitor the position of the substrate table WT1 during alignment measurements. A processor PR may receive data from the alignment system AS and also receive substrate table WT1 position information. Since the substrate W1 is fixed on the substrate table WT1, position information relating to the substrate table WT1 may be taken as being position information relating to the substrate W1.

Figure 2:
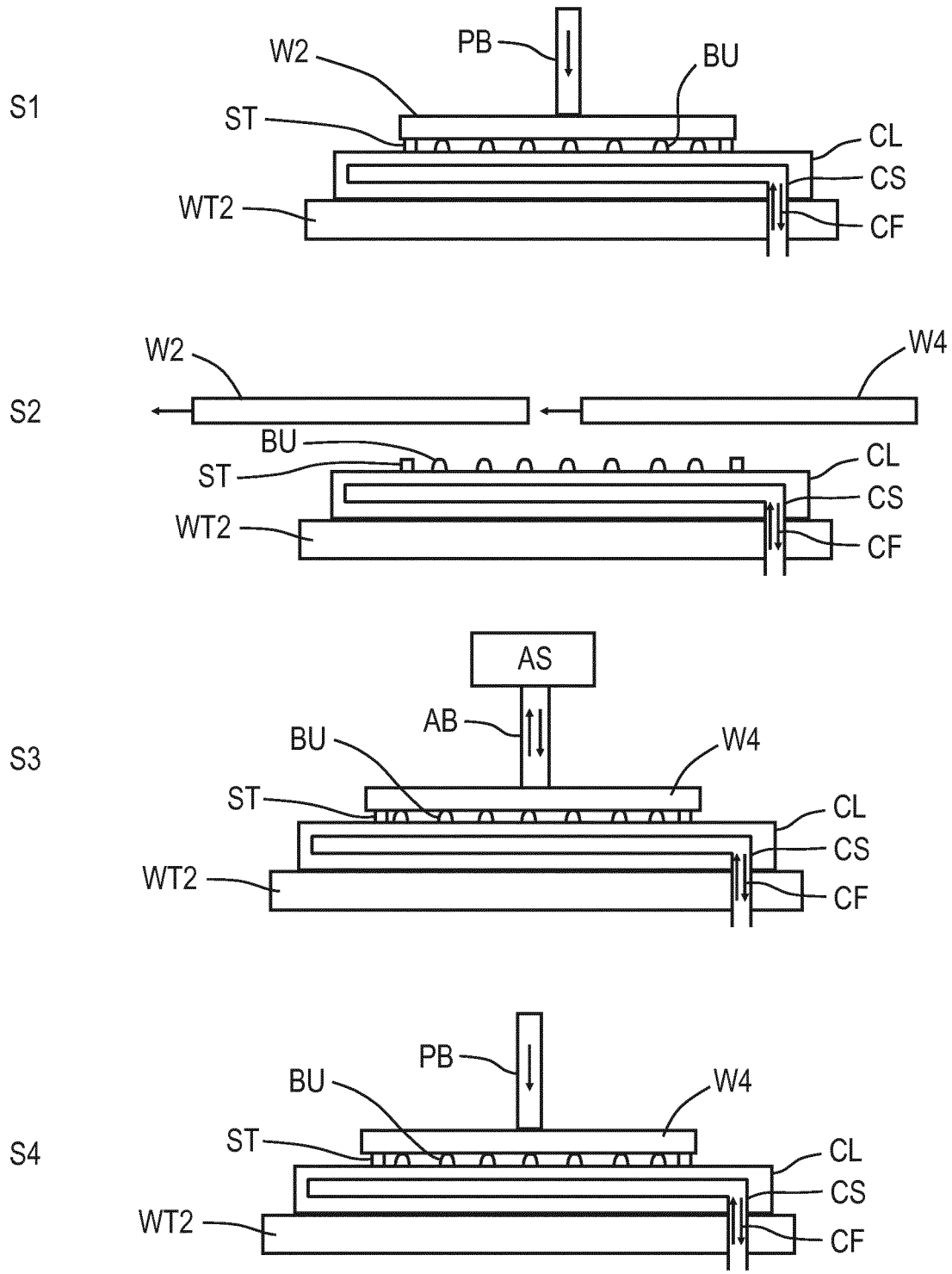
FIG. 2 is a schematic diagram of an example of a lithographic process experienced by a substrate table.

FIG. 2 is a schematic depiction of a process experienced by a substrate table in a lithographic apparatus. In step S1 a substrate W2 is exposed to a patterned radiation beam PB. Step S1 may be referred to as an exposure step. Whilst the substrate W2 is being exposed to the patterned radiation beam PB at the exposure side ES of the lithographic apparatus another substrate W1 is being measured by the alignment system AS on the measurement side MS of the lithographic apparatus. The substrate W2 has been measured (i.e. the substrate W2 has undergone alignment measurements, topography measurements, etc.) prior to undergoing a lithographic exposure. The substrate W2 is held by a substrate table WT2. The substrate W2 is supported by burls BU and optional support structures ST of the substrate table. The substrate table WT2 comprises a clamp CL that is configured to secure the substrate W2 to the substrate table WT2. The clamp CL may, for example, be a vacuum clamp or an electrostatic clamp comprising one or more electrodes.

The substrate table WT2 gains heat from the patterned radiation beam PB during a lithographic exposure and the substrate table WT2 increases in temperature. The increase in temperature of the substrate table WT2 depends in part upon one or more exposure settings of the lithographic apparatus. One or more exposure settings such as, for example, different illumination modes (e.g. quadrupole illumination, dipole illumination, etc.), die size, radiation dose, exposure slit size, a substrate table scanning speed, etc. may affect the increase in temperature of the substrate table WT2. The substrate table WT2 comprises a cooling system CS operative to cool the substrate table WT2. The cooling system CS may, for example, comprise a circuit of flowing cooling fluid CF. The cooling fluid CF may, for example, be water. The cooling system CS may be configured to cool the substrate table WT2 until the substrate table reaches a desired temperature.

In step S2, the substrate table WT2 is moved from the exposure side ES of the lithographic apparatus to the measurement side MS of the lithographic apparatus. Step S2 may be referred to as a substrate exchange step. Once at the measurement side MS, the substrate W2 is removed from the second substrate table WT2 and another substrate W4 is secured to the substrate table WT2. Throughout step S2 the substrate table WT2 continues to be cooled by the cooling system CS. Heat is removed from the substrate table WT2 by the cooling system CS, and the substrate table WT2 undergoes thermal contraction. When the substrate table WT2 undergoes thermal contraction the substrate that the substrate table WT2 is holding (i.e. the substrate W4) is deformed.

The substrate table WT2 is at a higher temperature than the substrate W4 when the substrate W4 is placed upon the substrate table WT2. This is because the substrate table WT2 has gained heat from the patterned radiation beam PB during step S1 whereas the substrate W4 has an ambient temperature of, for example, approximately 22° C. Heat transfers from the substrate table WT2 to the substrate W4, and the substrate W4 undergoes thermal expansion. When the substrate W4 undergoes thermal expansion the substrate W4 deforms. Thus, the substrate table WT2 contracts and at the same time the substrate W4 expands.

In step S3 the substrate W4 is measured. That is, the alignment system AS and any other measurement devices, e.g. a topography measurement system, are used to measure characteristics of the substrate W4. Step S3 may be referred to as a measurement step. Step S3 may comprise multiple measurement processes such as, for example, coarse alignment measurements, fine alignment measurements, topography measurements, etc. Step S3 includes an alignment measurement performed by the alignment system AS. An alignment radiation beam AB is incident on the substrate W4 and diffracts from alignment marks that are present on the substrate W4. Diffracted radiation is detected by the alignment system AS. The alignment measurement measures the position of the alignment marks on the substrate W4. The positions of the alignment marks may be recorded by the processor PR for future use.

After the alignment measurement has been performed there is a delay before the substrate W4 is exposed to the patterned radiation beam PB in a lithographic exposure. For example, during the delay a different substrate W1 may be undergoing a lithographic exposure on the exposure side ES of the lithographic apparatus. The substrate table WT2 is still being cooled by the cooling system CS to remove the heat absorbed by the substrate table from the patterned radiation beam PB during exposure step S1. The deformation of the substrate W4 caused by the thermal contraction of the substrate table WT2 and/or the thermal expansion of the substrate W4 continues after the alignment measurement has been performed. As a result of the continuing deformation of the substrate W4, the alignment marks on the substrate W4 experience thermal drift and change positions from the positions measured during the alignment measurement in step S3. The term "thermal drift" as used herein is intended to refer to a movement of an alignment mark on a substrate resulting from thermal energy. Thermal drift of the alignment mark positions between a time at which the alignment measurement is performed and a time at which the lithographic exposure is performed may negatively affect the accuracy of the lithographic exposure.

The extent of thermal drift experienced by a substrate when the substrate is exposed to EUV radiation may be greater than an extent of thermal drift experienced by a substrate when the substrate is exposed to DUV radiation. This is partly because convection cooling may occur in an DUV lithographic apparatus whereas in an EUV lithographic apparatus the substrate is typically held under vacuum conditions. The extent of thermal drift experienced by a substrate may be reduced in an immersion DUV lithographic apparatus because heat may be removed from the substrate table by a liquid present in an immersion hood of the immersion lithographic apparatus.

In step S4 the substrate W4 undergoes a lithographic exposure. That is, the patterned radiation beam PB is incident on target portions C of the substrate W4. Step S4 may be referred to as an exposure step. During exposure, the measured positions of the alignment marks are used by the processor PR to align the substrate W4 underneath the projection system PL such that a desired pattern is accurately projected onto the target portions C of the third substrate W4. The thermal drift of the alignment marks that occurs after measurement step S3 is completed results in the alignment marks changing position from where they were measured during step S3. The change in position of the alignment marks causes the substrate W4 to be misaligned under the projection system PL. The misalignment of the substrate W4 under the projection system PL will negatively affect the lithographic exposure of the substrate W4. For example, the misalignment may result in an overlay error.

Figure 3:
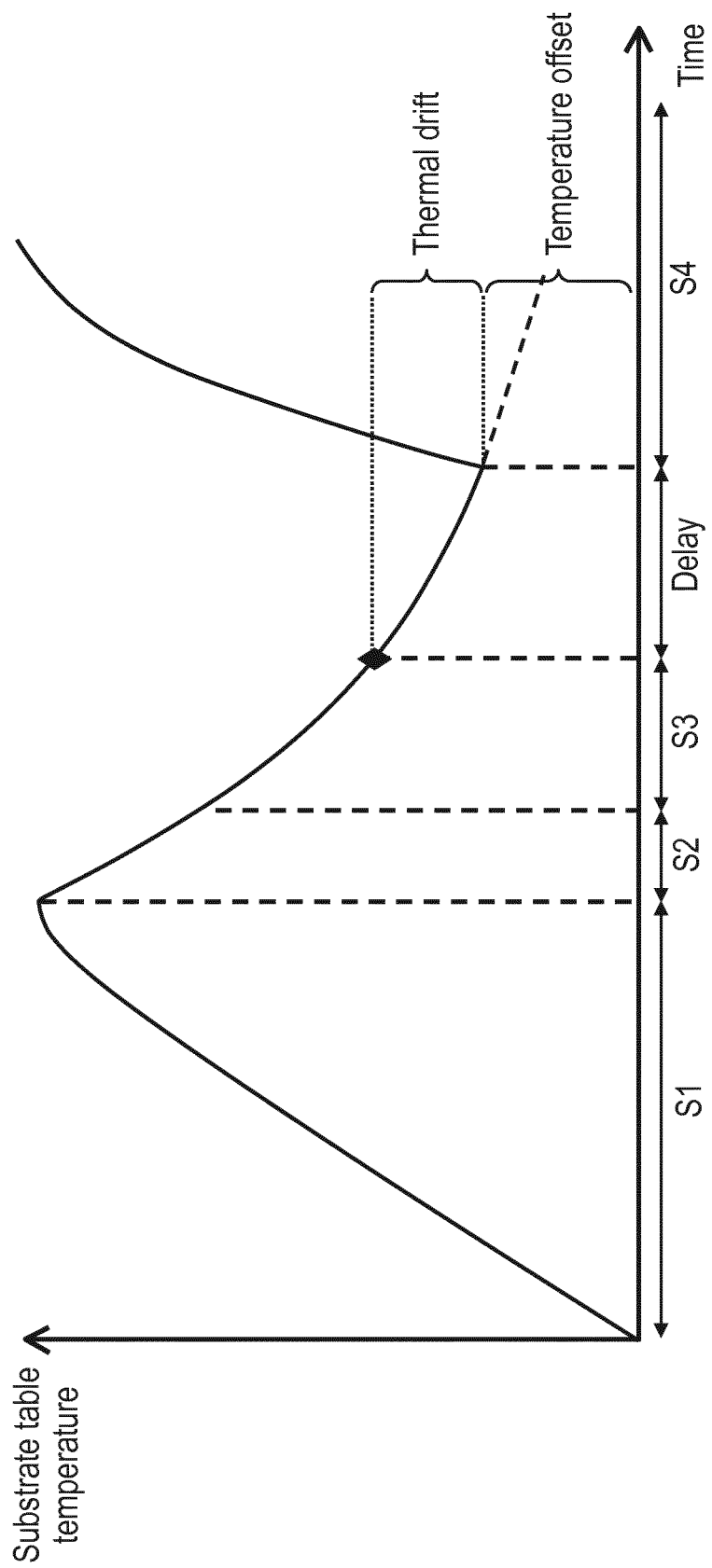
FIG. 3 is a graph of a temperature of a substrate table versus time during a lithographic process experienced by the substrate table.

FIG. 3 is a graph of the temperature of the substrate table WT2 versus time during the lithographic process experienced by the substrate table WT2. The steps S1-S4 schematically depicted in FIG. 2 are included along the time axis of FIG. 3. As may be seen from FIG. 3, the temperature of the substrate table WT2 increases throughout exposure step S1 due to the absorption of heat from the patterned radiation beam PB. For example, the temperature of the substrate table WT2 may increase by between approximately 1-10 mK over the course of step S1. Step S1 may, for example, take between approximately 10-30 seconds to complete. An algorithm may be used to predict the effects of the heating on the positions of alignment marks during the lithographic exposure. The algorithm may be configured to receive alignment measurements of alignment marks on the substrate and predict where the alignment marks will move to as a result of the heat gained by the substrate and the substrate table during a lithographic exposure. The algorithm may take into account one or more exposure settings such as, for example, different illumination modes (e.g. quadrupole illumination, dipole illumination, etc.), die size, radiation dose, exposure slit size, substrate table scanning speed, etc. when predicting the effects of the heating on the positions of alignment marks. The algorithm may determine one or more corrections to be applied to one or more projection system PL parameters so as to improve the accuracy of the lithographic exposure. The projection system PL parameters may, for example, comprise translation, magnification, rotation, third order effects, etc.

Once step S1 is completed, the substrate table WT2 begins to decrease in temperature because it no longer gains heat from the patterned radiation beam PB and it loses heat to the cooling fluid CF of the cooling system CS. The temperature of the substrate table WT2 continues to decrease throughout substrate exchange step S2 and measurement step S3. Step S2 may, for example, take between approximately 1-15 seconds to complete. Step S3 may, for example take between approximately 10-20 seconds to complete. At the end of step S3, after the alignment measurement of the alignment marks on the substrate W4 held by the substrate table WT2 has been performed, there is a delay. During the delay the lithographic exposure of another substrate W1 may be completed on the exposure side ES of the lithographic apparatus. The delay may, for example, last for between approximately 5-25 seconds. The substrate table WT2 is cooled by the cooling system CS during the delay. The substrate W4 deforms due to the cooling of the substrate table WT2 and the alignment marks experience a thermal drift from the positions that were measured during step S3. At exposure step S4 a lithographic exposure is performed on the substrate W4. The temperature of the substrate table WT2 increases due to heat transferring from the patterned radiation beam PB to the substrate table WT2. The substrate W4 is misaligned with respect to the projection system PL because the processor PR provides measured alignment mark positions from measurement step S3 that have a reduced accuracy due to the thermal drift experienced by the alignment marks between step S3 and exposure step S4.

A temperature offset of the substrate table WT2 may exist due to the lithographic exposure of the substrate W1 being performed when the substrate table WT2 was at a first temperature and the lithographic exposure of another substrate W4 being performed when the substrate table WT2 is at a higher temperature than the first temperature. The temperature offset of the substrate table WT2 between exposure step S1 and exposure step S4 may negatively affect the accuracy of the lithographic exposure performed at step S4. It may be desirable to cool the substrate table WT2 such that, at the beginning of step S4, the substrate table WT2 is at the same temperature that it was at the beginning of step S1. That is, it may be desirable to cool the substrate table WT2 to reduce the temperature offset between lithographic exposures for different substrates. However, cooling the substrate table WT2 takes time and therefore negatively affects the throughput of the lithographic apparatus. A balance may be found between cooling the substrate table WT2 to reduce the temperature offset and accepting a lithographic exposure accuracy penalty. The negative effect on accuracy caused by the temperature offset is expected to be smaller than the negative effect on accuracy caused by thermal drift.

One method of reducing the thermal drift of alignment marks between measurement step S3 and exposure step S4 comprises providing heat to the substrate table WT2 to reduce cooling of the substrate table WT2 between a time at which the alignment measurement is performed on a substrate held by the substrate table and a time at which the lithographic exposure is performed on the substrate held by the substrate table.

Figure 4:
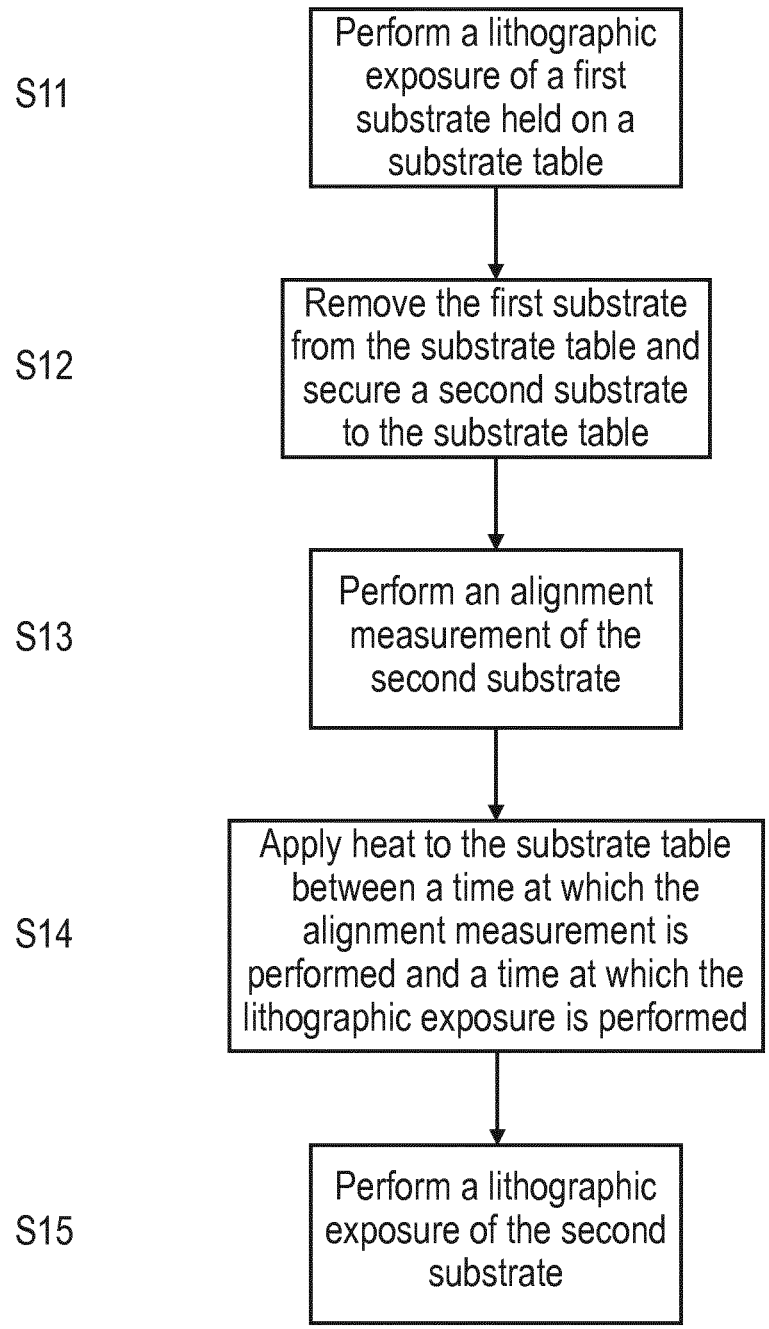
FIG. 4 is a flowchart of a method according to an embodiment of the invention.

FIG. 4 is a flowchart of a method of reducing the thermal drift of alignment marks between a time at which the alignment measurement is performed and a time at which the lithographic exposure is performed. In step S11 a lithographic exposure is performed on a first substrate, the first substrate being held on a substrate table. Step S11 may be referred to as an exposure step. The substrate table gains heat during step S11. In step S12 the first substrate is removed from the substrate table and a second substrate is secured to the substrate table. Step S12 may be referred to as a substrate exchange step. In step S13 an alignment measurement of the second substrate is performed. Step 13 may, for example, include measurements performed by the alignment system AS and any other measurement devices, e.g. a topography measurement system. Step S13 may be referred to as a measurement step. Step S13 may comprise multiple measurement processes such as, for example, coarse alignment measurements, topography measurements, fine alignment measurements, etc.

In step S14 heat is applied to the substrate table between a time at which the alignment measurement is performed and a time at which the lithographic exposure is performed. Step S14 may be referred to as a substrate table heating step. Step S14 may commence before measurement step S13 has begun. Substrate table heating step S14 may commence during measurement step S13. Substrate table heating step S14 may commence after measurement step S13 is complete. The amount of heat applied to the substrate table may be varied over time. For example, a first amount of heat may be applied to the substrate table over time in order to stabilize the temperature of the substrate table then a second amount of heat that is less than the first amount of heat may be applied to the substrate table over time in order to maintain the stabilized temperature of the substrate table. For example, heat may be applied to the substrate table via one or more electrical heaters. As a further example, heat may be applied to the substrate table via a fluid flowing through a heating channel provided in the substrate table. Other methods of applying heat to the substrate table may be used. The heat may be applied to the clamp CL.

As discussed earlier, the amount of heat gained by a substrate table during a lithographic exposure (i.e. step S11) depends in part upon the exposure settings of the lithographic apparatus. The amount of heat applied to the substrate table during step S14 may be changed depending upon one or more of the exposure settings of the lithographic apparatus during exposure step S11. Step S14 may finish on or before the commencement of step S15. In step S15 a lithographic exposure of the second substrate is performed. Step S15 may be referred to as an exposure step.

Figure 5:
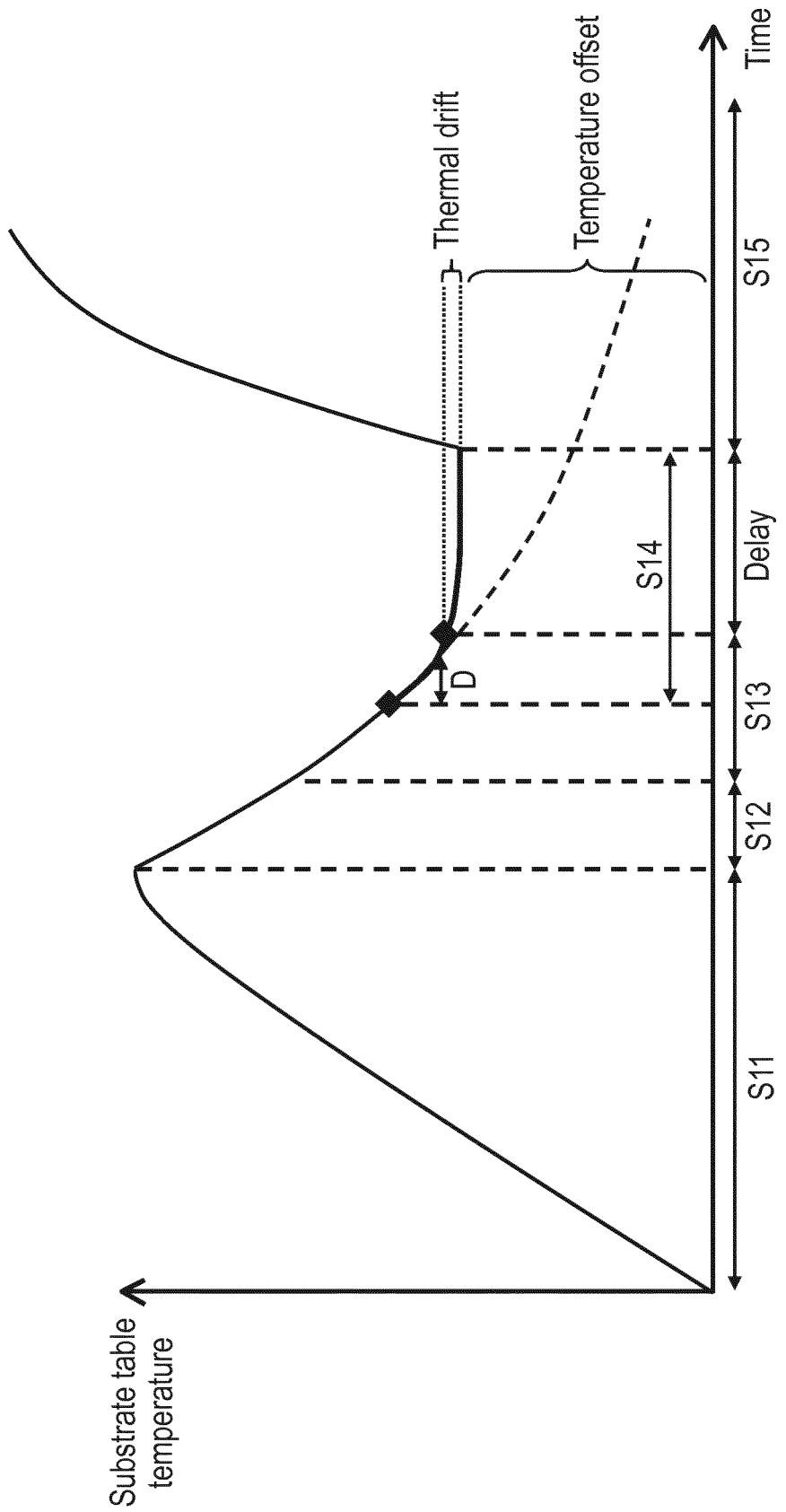
FIG. 5 is a graph of a temperature of a substrate table versus time during a lithographic process experienced by the substrate table according to an embodiment of the invention.

FIG. 5 is a graph of the temperature of a substrate table versus time during a lithographic process according to the flowchart of FIG. 4. The steps S11-S15 are included along the time axis of the graph of FIG. 5 for clarity. As was the case in FIG. 3, the temperature of the substrate table increases during the lithographic exposure of step S11. Once step exposure S11 is complete, the temperature of the substrate table begins to decrease due to a cooling of the substrate table provided by the cooling system CS. The temperature of the substrate table continues to decrease throughout substrate exchange step S12.

In the example of FIG. 5, substrate table heating step S14 commences during measurement step S13. The heat applied to the substrate table during step S14 acts to reduce the decrease in temperature of the substrate table. The dashed curved line of FIG. 5 indicates the temperature of the substrate table over time if no heat was applied to the substrate table between the end of measurement step S13 and the beginning of exposure step S15.

As can be seen on comparison between FIG. 3 and FIG. 5, the application of heat to the substrate table reduces a thermal drift of the alignment marks present on the substrate that is held by the substrate table. The reduced thermal drift of alignment marks results in a more accurate lithographic exposure at step S15 because the alignment marks (and target portions C) are closer to their measured positions (i.e. the positions measured during step S13). For example, the application of heat to the substrate table may reduce an overlay error of the lithographic exposure by approximately 0.2 nm compared to a lithographic exposure performed with no heating of the substrate table.

Step S14 may commence before step S13 has begun. Commencing substrate table heating step S14 before measurement step S13 has begun or during step S13 may advantageously provide time for the temperature of the substrate table to stabilize such that the thermal drift is reduced between measurement step S13 and exposure step S15. In the example of FIG. 5, heat is applied to the substrate table during the measurement step S13 such that once step S13 is complete, the temperature of the substrate table decreases by a small amount during the "Delay" interval before stabilizing. Alternatively, applying heat to the substrate table before or during measurement step S13 may enable the temperature of the substrate table to be reduced gradually such that the substrate table stays at the same temperature throughout the "Delay" interval depicted in FIG. 5, thus achieving zero thermal drift. That is, the application of heat may be configured such that a temperature of the substrate table at the time at which the alignment measurement is performed is the same as the temperature of the substrate table at a time at which the lithographic exposure of the substrate is performed. Step S14 may commence after step S13 is complete. Commencing substrate table heating step S14 after step 13 is complete may not reduce the thermal drift as much as commencing substrate table heating step S14 before or during measurement step S13. This is because the temperature of the substrate table will continue to decrease after the completion of step S13 until the heat applied to the substrate table stabilizes the temperature of the substrate table. Even if the substrate table heating step S14 is commenced immediately after the completion of measurement step S13, the temperature of the substrate table WT2 will not instantaneously stabilize, thus there will be some thermal drift.

As may be seen on comparison of FIG. 3 and FIG. 5, a temperature offset of the substrate table WT2 has increased as a result of the application of heat to the substrate table WT2 in step S14. The increased temperature offset may negatively affect the accuracy of the lithographic exposure performed at step S15. However, this negative effect on lithographic accuracy is of a smaller magnitude than the positive effect on lithographic accuracy brought about by applying heat to the substrate table WT2. Therefore, applying heat to the substrate table WT2 provides a net improvement to lithographic accuracy.

The algorithm that may be used to predict the effects of heating on the positions of alignment marks during a lithographic exposure may be improved by the method of providing heat to the substrate table described herein. That is, decreasing the thermal drift experienced by alignment marks between a time at which the alignment measurement is performed and a time at which the lithographic exposure is performed may increase the accuracy of corrections that are determined by the algorithm.

The temperature of the substrate table WT2 at the end of exposure step S15 is greater than the temperature of the substrate table WT2 at the end of exposure step S11. The temperature of the substrate table WT2 may reach increasingly high temperatures after successive lithographic exposures. The temperature offset experienced by the substrate table WT2 may decrease after each successive lithographic exposure. The temperature of the substrate table WT2 may saturate after a number of lithographic exposures. That is, the temperature of the substrate table WT2 may reach a maximum value after a number of successive lithographic exposures have taken place. The temperature of the substrate table WT2 when undergoing a contemporary lithographic process (e.g. the method depicted in FIG. 3) may saturate after, for example, 7-10 lithographic exposures. The temperature of the substrate table WT2 undergoing a lithographic process according to the method described herein (e.g. the method depicted in FIG. 5) may saturate after, for example, 4-7 lithographic exposures. A saturation temperature of the substrate table WT2 may be reached after a smaller number of lithographic exposures as a result of heat being applied to the substrate table WT2 between a time at which an alignment measurement is performed and a time at which a lithographic exposure is performed. Reaching the saturation temperature after a smaller number of lithographic exposures may be beneficial because fewer lithographic exposures may suffer the negative effects caused by thermal drift, such as decreased lithographic accuracy, due to successive substrates experiencing similar thermal effects once the saturation temperature of the substrate table has been reached.

Heat may be applied to the substrate table by one or more heating elements. The cooling system is a separate entity to the one or more heating elements. The heat may be distributed across the substrate table such that a desired temperature is achieved across the substrate table. For example, if the heat transferred to the substrate table during exposure step S11 is distributed unevenly across the substrate table then multiple electrical heaters may be distributed across the substrate table such that more heat is transferred to some regions of the substrate table than others in substrate table heating step S14. The heat may be applied to the substrate table at pre-determined intervals. That is, if the temperature changes experienced by the substrate table during a lithographic process are known then heat may be applied to the substrate table at a pre-determined interval in the lithographic process. The interval consists of a starting time, a duration and a finishing time. The interval may depend upon the known temperature changes of the substrate table during the lithographic process. This method of applying heat to the substrate table may be considered as being a feedforward method.

The temperature of the substrate table may be monitored. Results of the monitoring may be used to determine a time at which the application of heat to the substrate table commences. Results of the monitoring may be used to determine a rate at which heat is applied to the substrate table. As may be seen in FIG. 5, a delay D between a time at which heat is applied to the substrate table and a time at which the substrate table changes temperature due to the heat provided by the heating element may exist. The extent of the delay depends at least in part upon thermal response times of the heating element, the substrate table and/or the clamp and the amount of time taken for heat to travel from the heating element to the substrate table and/or the clamp. The delay D may, for example, last between approximately 1-10 seconds. The delay D may last for a longer or a shorter amount of time. The delay D may be accounted for when selecting at a time at which heat is to be applied to the substrate table.

Figure 6:
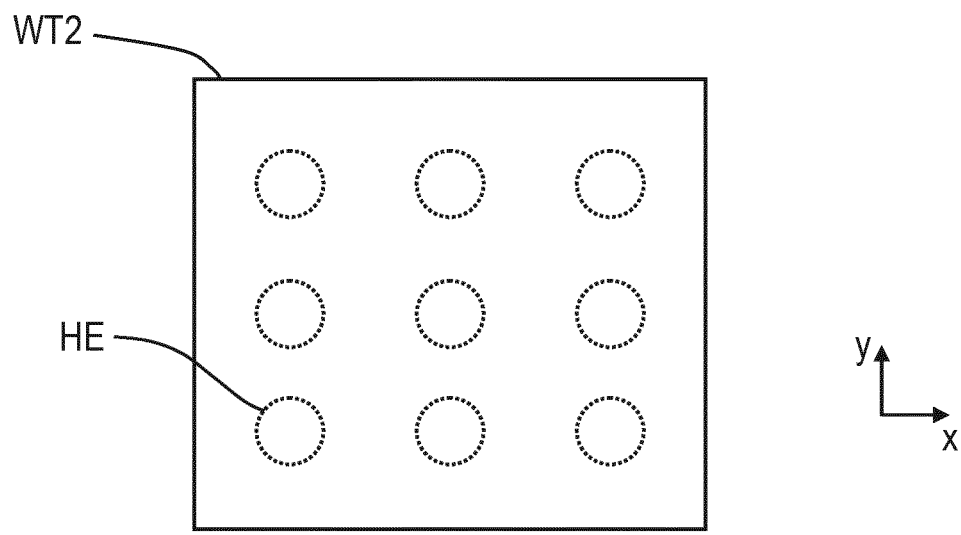
FIG. 6 schematically depicts a substrate table according to an embodiment of the invention.

FIG. 6 is a schematic depiction of a substrate table WT2 viewed from above comprising multiple heating elements HE. The heating elements HE may, for example, be electrical heaters. In the example embodiment of FIG. 6, the heating elements HE are distributed evenly across the substrate table WT2 to provide even heating of the substrate table WT2.

Figure 7:
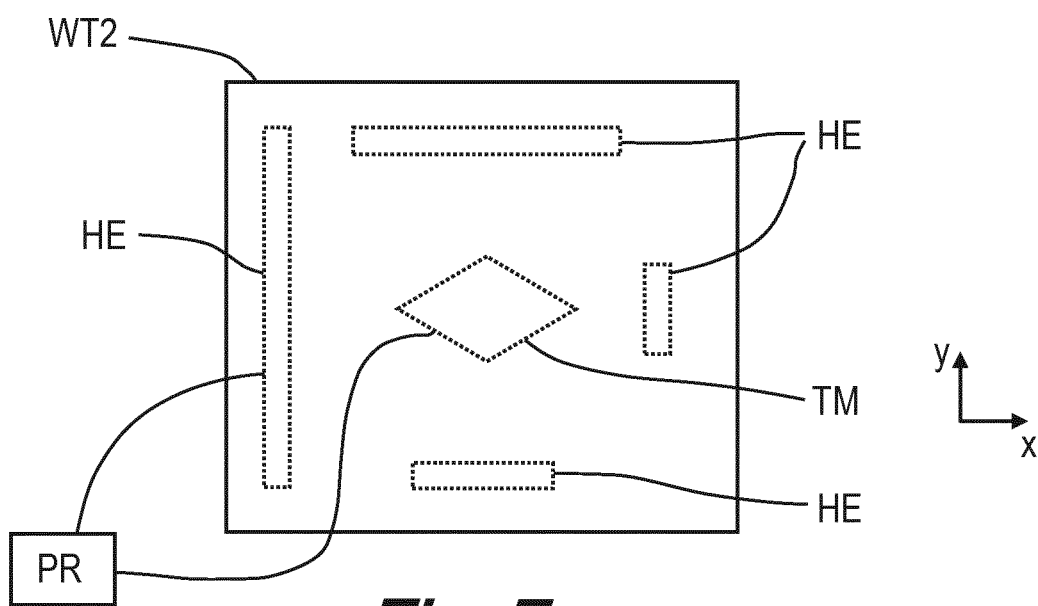
FIG. 7 schematically depicts a substrate table according to an embodiment of the invention.

Alternatively, the heating elements HE may be distributed unevenly across the substrate table WT2 such as, for example, in the schematic depiction of FIG. 7. The heating elements HE may take any shape and may be located at any desired position on the substrate table WT2. In the example of FIG. 7, the substrate table WT2 comprises a temperature monitor TM. The temperature monitor TM is configured to monitor the temperature of the substrate table WT2. The temperature monitor may provide temperature measurements of the substrate table WT2 to the processor PR. The processor PR is configured to receive information from the temperature monitor TM and use the information to control the heating elements HE.

In general, a lithographic apparatus may implement the method described herein via a feedback loop. The feedback loop may comprise a temperature monitor configured to monitor a temperature of the substrate table, a heating element configured to apply heating to the substrate table and a processor configured to control the heating element using information received from the temperature monitor. The feedback loop may be configured to reduce cooling of the substrate table provided by the cooling system. The processor may be configured to determine a delay D between a time at which the heating element provides heat to the substrate table and a time at which the substrate table changes temperature due to the heat provided by the heating element. The processor may account for the determined delay D when controlling the application of heat to the substrate table via the heating element. The substrate table may, for example, require approximately 1-35 W for a length of time between approximately 1-10 seconds. For example, the processor may receive information from the temperature monitor and determine therefrom that the substrate table requires approximately 5 W of power for approximately 7 seconds before the exposure step S15 takes place in order to reduce the thermal drift experienced by the substrate. The processor may then control the heating element such that the substrate table receives approximately 5 W of power in approximately 7 seconds. The processor may, for example, control the heating element via pulse-width modulation of an electrical current provided to the heating element. Pulse-width modulation involves changing the power provided to the heating element by altering a duty cycle of a power supply that provides power to the heating element. The processor may control the heating elements using other techniques.

A computer apparatus for controlling a lithographic apparatus may comprise a memory storing processor readable instructions and a processor arranged to read and execute instructions stored in said memory. The processor readable instructions may comprise instructions arranged to control the computer to carry out the method of applying heat to the substrate table to reduce a cooling of the substrate table provided by the cooling system.

In the future, lithographic exposures may be performed using higher doses of radiation. Higher doses of radiation may increase the temperature of the substrate table to higher temperatures at greater speeds. Throughput is expected to increase in future lithographic apparatus and processes in future lithographic apparatus (e.g. the substrate exchange in step S12) are expected to be performed in less time. The combination of higher substrate table temperatures and faster processes means that the alignment measurement of a substrate (i.e. measurement step S13) is expected to commence at a time when the substrate table temperature is still relatively high (i.e. an alignment measurement such as step S13 is expected to commence a shorter amount of time after a lithographic exposure such as exposure step S11 has finished). The period of time across which thermal drift of alignment marks from their measured positions occurs is expected to commence in a region of the graph shown in FIG. 5 between the end of exposure step S11 and before the start of measurement step S13 (i.e. at a region of the graph that has a steeper rate of temperature change gradient). The steeper gradient of the substrate table may increase the extent of the thermal drift of alignment marks between alignment measurement and lithographic exposure in future lithographic apparatus, thus negatively affecting the accuracy of a lithographic exposure. The reduction of the thermal drift of alignment marks provided by the invention described herein may therefore be of great importance to the accuracy of lithographic exposures of the future.

Although embodiments of the invention have been described and depicted herein in relation to a dual stage lithographic apparatus, embodiments of the invention may be used in other lithographic apparatus such as, for example, single stage lithographic apparatus.

The illumination optics, optics and detection optics may encompass various types of optical components, including refractive, reflective, and catadioptric optical components for directing, shaping, or controlling the beam of radiation. The lithographic apparatus may be suitable for use with EUV radiation. That is, the invention described herein may be used in conjunction with a lithographic apparatus that is of a reflective type rather than a transmissive type (e.g. employing a programmable mirror array of a type as referred to above).

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of performing a lithographic exposure of a substrate, the substrate being held on a substrate table, the substrate table comprising a cooling system operative to cool the substrate table, the method comprising:
    performing an alignment measurement of the substrate;
    applying heat to the substrate table to reduce cooling of the substrate table provided by the cooling system, the heat being applied between a time at which the alignment measurement is performed and a time at which the lithographic exposure is performed; and
    performing the lithographic exposure of the substrate,
    wherein:
       the application of heat is configured to reduce a thermal drift of the substrate between the time at which the alignment measurement is performed and the time at which the lithographic exposure is performed; and
       the application of heat is configured such that a temperature of the substrate table at the time at which the alignment measurement is performed is about the same as the temperature of the substrate table at the time at which the lithographic exposure is performed.

2. The method of claim 1, wherein the application of heat is commenced before the alignment measurement has begun.

3. The method of claim 1, wherein the application of heat is commenced during the alignment measurement.

4. The method of claim 1, wherein the amount of heat applied to the substrate table is varied over time.

5. The method of claim 1, wherein the heat is distributed across the substrate table to achieve a desired temperature across the substrate table.

6. The method of claim 1, wherein a delay between applying heat to the substrate table and the substrate table changing temperature due to the heat applied to the substrate table is accounted for when applying heat to the substrate table.

7. The method of claim 1, wherein:
    the substrate table comprises a clamp configured to secure the substrate to the substrate table, and
    the heat is applied to the clamp.

8. The method of claim 1, wherein the application of heat is based on an exposure setting of the lithographic exposure.

9. The method of claim 1, wherein:
    temperature changes of the substrate table during a lithographic process are known; and
    the application of heat occurs during a pre-determined interval in the lithographic process, the interval depending on the known temperature changes of the substrate table.

10. The method of claim 1, wherein a temperature of the substrate table is monitored.

11. The method of claim 10, wherein results of the monitoring are used to determine a rate at which heat is applied to the substrate table.

12. A substrate table for holding a substrate, comprising:
    a cooling system operative to cool the substrate table; and
    a heating element configured to:
       apply, between a time at which an alignment measurement of the substrate is performed and a time at which a lithographic exposure of the substrate is performed, heat to the substrate table to reduce cooling of the substrate table provided by the cooling system, wherein:

the application of heat is configured to reduce a thermal drift of the substrate between the time at which the alignment measurement is performed and the time at which the lithographic exposure is performed; and the application of heat is configured such that a temperature of the substrate table at the time at which the alignment measurement is performed is about the same as the temperature of the substrate table at the time at which the lithographic exposure is performed.

13. The substrate table of claim 12, wherein the heating element is further configured to reduce the thermal drift of a set of alignment marks positioned on the substrate.

14. The substrate table of claim 12, wherein the heating element comprises an electrical heater.

15. The substrate table of claim 12, wherein:

the heating element comprises multiple electrical heaters, and the electrical heaters are distributed across the substrate table to achieve a desired temperature across the substrate table.

16. A computer program comprising computer readable instructions configured to cause a computer to carry out operations comprising:

performing an alignment measurement of a substrate;

applying heat to a substrate table configured to support the substrate to reduce cooling of the substrate table provided by a cooling system, the heat being applied between a time at which the alignment measurement is performed and a time at which a lithographic exposure is performed; and performing the lithographic exposure of the substrate, wherein:

the application of heat is configured to reduce a thermal drift of the substrate between the time at which the alignment measurement is performed and the time at which the lithographic exposure is performed; and the application of heat is configured such that a temperature of the substrate table at the time at which the alignment measurement is performed is about the same as the temperature of the substrate table at the time at which the lithographic exposure is performed.

17. A computer readable medium for storing computer readable code wherein the code causes a lithographic apparatus to perform operations comprising:

performing an alignment measurement of a substrate;

applying heat to a substrate table configured to support the substrate to reduce cooling of the substrate table provided by a cooling system, the heat being applied between a time at which the alignment measurement is performed and a time at which a lithographic exposure is performed; and performing the lithographic exposure of the substrate, wherein:

the application of heat is configured to reduce a thermal drift of the substrate between the time at which the alignment measurement is performed and the time at which the lithographic exposure is performed; and the application of heat is configured such that a temperature of the substrate table at the time at which the alignment measurement is performed is about the same as the temperature of the substrate table at the time at which the lithographic exposure is performed.

18. A computer apparatus for controlling a lithographic apparatus, the computer apparatus comprising:

a memory storing processor readable instructions; and a processor arranged to read and execute instructions stored in the memory;

wherein:

the processor readable instructions comprise instructions arranged to control the computer to carry out operations comprising:

performing an alignment measurement of a substrate;

applying heat to a substrate table configured to support the substrate to reduce cooling of the substrate table provided by a cooling system, the heat being applied between a time at which the alignment measurement is performed and a time at which a lithographic exposure is performed; and performing the lithographic exposure of the substrate:

the application of heat is configured to reduce a thermal drift of the substrate between the time at which the alignment measurement is performed and the time at which the lithographic exposure is performed; and the application of heat is configured such that a temperature of the substrate table at the time at which the alignment measurement is performed is about the same as the temperature of the substrate table at the time at which the lithographic exposure is performed.

19. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table being configured to hold a substrate, the substrate table comprising a cooling system operative to cool the substrate table; and a heating element configured to:

apply, between a time at which an alignment measurement of the substrate is performed and a time at which a lithographic exposure of the substrate is performed, heat to the substrate table to reduce cooling of the substrate table provided by the cooling system, wherein:

the application of heat is configured to reduce a thermal drift of the substrate between the time at which the alignment measurement is performed and the time at which the lithographic exposure is performed; and the application of heat is configured such that a temperature of the substrate table at the time at which the alignment measurement is performed is about the same as the temperature of the substrate table at the time at which the lithographic exposure is performed.

20. The lithographic apparatus of claim 19, further comprising:

a feedback loop, the feedback loop comprising a temperature monitor configured to monitor a temperature of the substrate table, the heating element, and a processor configured to control the heating element using information received from the temperature monitor, the feedback loop being configured to reduce cooling of the substrate table provided by the cooling system.

21. The lithographic apparatus of claim 20, wherein the processor is further configured to:
- account for a delay between the application of heat to the substrate table and the substrate table changing temperature due to the heat applied to the substrate table; or
- control the heating element via pulse-width modulation of an electrical current provided to the heating element.

* * * * *